(12) United States Patent
Busche et al.

(10) Patent No.: US 8,970,114 B2
(45) Date of Patent: Mar. 3, 2015

(54) TEMPERATURE CONTROLLED WINDOW OF A PLASMA PROCESSING CHAMBER COMPONENT

(71) Applicant: Lam Research Corporation, Fremont, CA (US)

(72) Inventors: Matt Busche, Santa Clara, CA (US); Adam Mace, San Jose, CA (US); Michael Kang, San Ramon, CA (US); Allan Ronne, Santa Clara, CA (US)

(73) Assignee: Lam Research Corporation, Fremont, CA (US)

( * ) Notice: Subject to any disclaimer, the term of this patent is extended or adjusted under 35 U.S.C. 154(b) by 88 days.

(21) Appl. No.: 13/756,986

(22) Filed: Feb. 1, 2013

(65) Prior Publication Data

US 2014/0217895 A1    Aug. 7, 2014

(51) Int. Cl.
*H01J 7/24*    (2006.01)
*H01J 37/32*    (2006.01)

(52) U.S. Cl.
CPC ..... *H01J 37/32522* (2013.01); *H01J 37/32119* (2013.01)
USPC ............ 315/117; 315/111.21; 315/111.81; 156/345.34; 156/345.29

(58) Field of Classification Search
CPC .................. H05B 33/0854; F21Y 2101/02
USPC ........................... 315/111.21–81, 117
See application file for complete search history.

(56) References Cited

U.S. PATENT DOCUMENTS

| | | | |
|---|---|---|---|
| 4,565,601 A | 1/1986 | Kakehi et al. | |
| 4,729,424 A | 3/1988 | Mizuno et al. | |
| 4,802,338 A | 2/1989 | Oswalt et al. | |
| 4,948,458 A | 8/1990 | Ogle | |
| 5,034,688 A | 7/1991 | Moulene et al. | |
| 5,199,483 A | 4/1993 | Bahng | |
| 5,540,824 A | 7/1996 | Yin et al. | |
| 5,740,016 A | 4/1998 | Dhindsa | |
| 5,776,553 A * | 7/1998 | Jaffe et al. | 427/577 |
| 5,846,883 A | 12/1998 | Moslehi | |
| 5,863,376 A | 1/1999 | Wicker et al. | |
| 5,888,907 A | 3/1999 | Tomoyasu et al. | |
| 6,015,465 A * | 1/2000 | Kholodenko et al. | 118/719 |
| 6,063,233 A * | 5/2000 | Collins et al. | 156/345.37 |
| 6,074,512 A * | 6/2000 | Collins et al. | 156/345.29 |
| 6,148,626 A | 11/2000 | Iwamoto | |

(Continued)

*Primary Examiner* — Douglas W Owens
*Assistant Examiner* — Srinivas Sathiraju
(74) *Attorney, Agent, or Firm* — Buchanan Ingersoll & Rooney PC

(57) ABSTRACT

A temperature controlled dielectric window of an inductively coupled plasma processing chamber includes a dielectric window forming a top wall of the plasma processing chamber having at least first and second channels therein. A liquid circulating system includes a source of cold liquid circulating in a first closed loop which is not in fluid communication with the channels, a source of hot liquid circulating in a second closed loop which is in fluid communication with the channels, and first and second heat exchangers. The cold liquid passes through the first heat exchanger at a controllable flow rate and temperature of the hot liquid is adjusted by heat exchange with the cold liquid as the hot liquid passes through the first heat exchanger and then through the inlet of the first channel. The cold liquid passes through the second heat exchanger at a controllable flow rate and temperature of the hot liquid is adjusted by heat exchange with the cold liquid as the hot liquid passes through the second heat exchanger and then through the inlet of the second channel.

20 Claims, 9 Drawing Sheets

(56) References Cited

U.S. PATENT DOCUMENTS

| | | | |
|---|---|---|---|
| 6,180,926 B1 | 1/2001 | Duddy et al. | |
| 6,206,972 B1 | 3/2001 | Dunham | |
| 6,308,776 B1 | 10/2001 | Sloan et al. | |
| 6,394,797 B1 | 5/2002 | Sugaya et al. | |
| 6,433,314 B1 | 8/2002 | Mandrekar et al. | |
| 6,440,221 B2* | 8/2002 | Shamouilian et al. | 118/724 |
| 6,514,376 B1* | 2/2003 | Collins et al. | 156/345.37 |
| 6,822,202 B2 | 11/2004 | Atlas | |
| 6,866,094 B2 | 3/2005 | Cousineau et al. | |
| 6,916,399 B1 | 7/2005 | Rozenzon et al. | |
| 6,993,919 B2 | 2/2006 | Hirooka et al. | |
| 7,000,416 B2 | 2/2006 | Hirooka et al. | |
| 7,033,444 B1 | 4/2006 | Komino et al. | |
| 7,180,036 B2 | 2/2007 | Atlas | |
| 7,196,283 B2 | 3/2007 | Buchberger, Jr. et al. | |
| 7,334,630 B2 | 2/2008 | Goodson et al. | |
| 7,436,645 B2 | 10/2008 | Holland et al. | |
| 7,854,820 B2* | 12/2010 | De La Llera et al. | 156/345.34 |
| 7,993,460 B2 | 8/2011 | Steger | |
| 8,012,305 B2* | 9/2011 | Takahashi | 156/345.28 |
| 8,075,729 B2 | 12/2011 | Holland et al. | |
| 8,110,044 B2 | 2/2012 | Nozawa et al. | |
| 8,216,486 B2 | 7/2012 | Dhindsa et al. | |
| 8,410,393 B2 | 4/2013 | Ricci et al. | |
| 8,525,419 B2* | 9/2013 | Smith et al. | 315/111.81 |
| 8,641,977 B2* | 2/2014 | Snowball | 422/186.04 |
| 8,702,866 B2* | 4/2014 | Augustino et al. | 118/715 |
| 8,709,202 B2* | 4/2014 | De La Llera et al. | 156/345.34 |
| 8,742,665 B2* | 6/2014 | Lubomirsky et al. | 315/111.01 |
| 8,747,559 B2* | 6/2014 | Steger | 118/728 |
| 2001/0047760 A1 | 12/2001 | Moslehi | |
| 2003/0087488 A1 | 5/2003 | Fink et al. | |
| 2003/0209324 A1 | 11/2003 | Fink | |
| 2004/0028837 A1 | 2/2004 | Fink | |
| 2004/0140054 A1 | 7/2004 | Johnson | |
| 2004/0187787 A1 | 9/2004 | Dawson et al. | |
| 2005/0145341 A1 | 7/2005 | Suzuki | |
| 2005/0224182 A1 | 10/2005 | Edamura et al. | |
| 2007/0079936 A1 | 4/2007 | Li et al. | |
| 2010/0003826 A1 | 1/2010 | O'Donnell et al. | |
| 2010/0116788 A1* | 5/2010 | Singh et al. | 216/66 |
| 2010/0243606 A1 | 9/2010 | Koshimizu et al. | |
| 2011/0061812 A1* | 3/2011 | Ganguly et al. | 156/345.34 |
| 2011/0114601 A1* | 5/2011 | Lubomirsky et al. | 216/68 |
| 2011/0284167 A1 | 11/2011 | Nishio | |
| 2013/0105083 A1* | 5/2013 | Shih et al. | 156/345.29 |
| 2014/0065827 A1* | 3/2014 | Kang et al. | 438/694 |

* cited by examiner

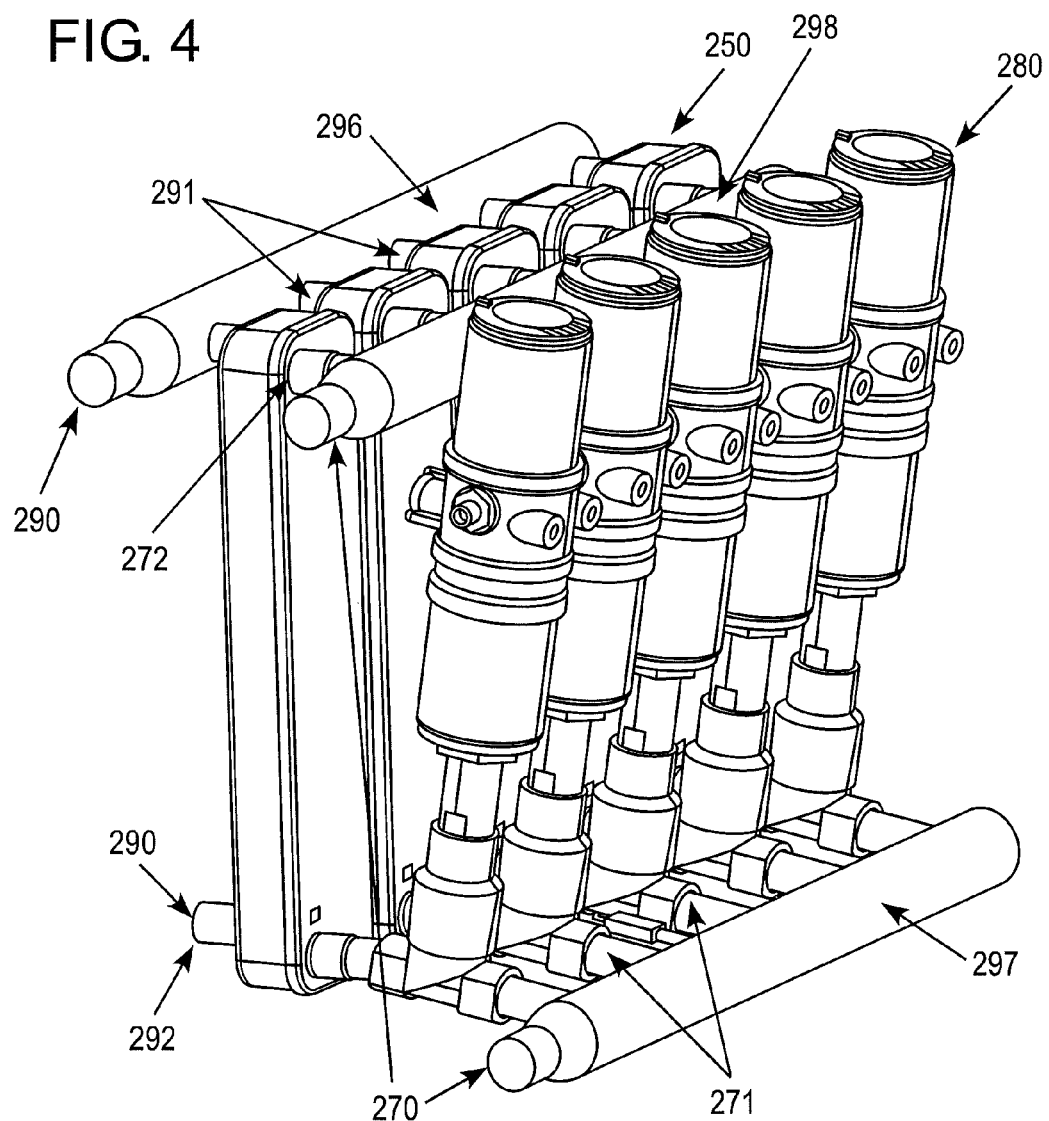

TEMPERATURE CONTROLLED WINDOW OF A PLASMA PROCESSING CHAMBER COMPONENT

FIELD OF THE INVENTION

The present disclosure relates to temperature control of a window of a plasma processing chamber. More specifically, the present disclosure relates to temperature control of the window by circulating a hot liquid through channels in the window and individually controlling the temperature of the hot liquid in each channel

BACKGROUND

Plasma processing apparatuses are used to process substrates by techniques including etching, physical vapor deposition (PVD), chemical vapor deposition (CVD), ion implantation, and resist removal. One type of plasma processing apparatus used in plasma processing includes an inductively coupled plasma (ICP) chamber which has an RF antenna in the form of one or more RF coils to excite a process gas into the plasma state to process substrates in the chamber. Due to shrinking feature sizes and the implementation of new materials, improvement in plasma processing apparatuses to control the conditions of the plasma processing is required.

In ICP chambers, a ceramic window separates the chamber from the RF source, such as an RF antenna or RF coils. The brittle nature of the ceramic window material poses a limitation to the RF power used because as the RF power increases, heat flux into the ceramic window increases. The heat flux leads to temperature gradients, and thus internal stress in the ceramic window. Also, the distribution of heat flux can have a highly non-uniform distribution, which exacerbates the thermal stress problem.

SUMMARY

In an embodiment, temperature of a dielectric window of an inductively coupled plasma processing chamber is controlled using a liquid circulating system. The window includes at least first and second channels therein, each of the first and second channels having an inlet and outlet to circulate temperature controlled liquid in the channels. The liquid circulating system has a source of cold liquid circulating in a first closed loop which is not in fluid communication with the channels, a source of hot liquid circulating in a second closed loop which is in fluid communication with the channels, and at least first and second heat exchangers. The first heat exchanger is connected to the source of cold liquid, the source of hot liquid and the inlet of the first channel such that the cold liquid passes through the first heat exchanger at a controllable flow rate and temperature of the hot liquid is adjusted by heat exchange with the cold liquid as the hot liquid passes through the first heat exchanger and then through the inlet of the first channel. The second heat exchanger is connected to the source of cold liquid, the source of hot liquid and the inlet of the second channel such that the cold liquid passes through the second heat exchanger at a controllable flow rate and temperature of the hot liquid is adjusted by heat exchange with the cold liquid as the hot liquid passes through the second heat exchanger and then through the inlet of the second channel.

In an embodiment, the temperature controlled dielectric window further comprises a first closed loop that includes a main line, a first branch line in fluid communication with the main line and the first heat exchanger, a second branch line in fluid communication with the main line and the second heat exchanger, valves along the first and second branch lines and a return line which returns cold liquid from the first and second heat exchangers to the source of cold liquid, the liquid circulation system including a control system receiving signals from thermocouples embedded in the dielectric window and signals from control valves measuring flow rates of the cold liquid through the first and second heat exchangers, the control system operating the control valves to control a flow rate of the cold liquid through the first and second heat exchangers.

In an embodiment, the temperature controlled dielectric window further comprises a manifold overlying an upper surface of the dielectric window, the manifold having horizontally aligned flow passages vertically aligned with the inlets and outlets of the dielectric window and horizontally aligned mounting holes vertically aligned with mounting holes in the upper surface of the dielectric window.

In another embodiment, the temperature controlled dielectric window further comprises third, fourth and fifth channels and the liquid circulating system includes third, fourth and fifth heat exchangers. The third heat exchanger is connected to the source of cold liquid, the source of hot liquid and the inlet of the third channel such that the cold liquid passes through the third heat exchanger at a controllable flow rate and temperature of the hot liquid is adjusted by heat exchange with the cold liquid as the hot liquid passes through the third heat exchanger and then through the inlet of the third channel. The fourth heat exchanger is connected to the source of cold liquid, the source of hot liquid and the inlet of the fourth channel such that the cold liquid passes through the fourth heat exchanger at a controllable flow rate and temperature of the hot liquid is adjusted by heat exchange with the cold liquid as the hot liquid passes through the fourth heat exchanger and then through the inlet of the fourth channel. The fifth heat exchanger is connected to the source of cold liquid, the source of hot liquid and the inlet of the fifth channel such that the cold liquid passes through the fifth heat exchanger at a controllable flow rate and temperature of the hot liquid is adjusted by heat exchange with the cold liquid as the hot liquid passes through the fifth heat exchanger and then through the inlet of the fifth channel. The first closed loop further includes a third branch line in fluid communication with the main line and the third heat exchanger, a fourth branch line in fluid communication with the main line and the fourth heat exchanger, a fifth branch line in fluid communication with the fifth heat exchanger, valves along the third, fourth and fifth branch lines and the return line returns cold liquid from the third, fourth and fifth heat exchangers to the source of cold liquid. The control system receives signals from thermocouples embedded in the dielectric window and signals from control valves measuring flow rates of the cold liquid through the third, fourth and fifth heat exchangers, the control system operating the control valves to control a flow rate of the cold liquid through the third, fourth and fifth heat exchangers.

In another embodiment, a method of controlling the temperature of a temperature controlled dielectric window installed in a plasma processing chamber is provided, the method comprising plasma processing a semiconducting substrate in the chamber comprising circulating a hot liquid through the at least first and second channels; and adjusting a temperature of the hot liquid flowing through the at least first and second channels to achieve a substantially uniform temperature across an inner surface of the dielectric window.

In an embodiment wherein the window further comprises third, fourth and fifth channels, the method comprises plasma processing a semiconducting substrate in the chamber comprising circulating a hot liquid through each of the first, second, third, fourth and fifth channels; and adjusting a temperature of the hot liquid flowing through each of the first, second, third, fourth and fifth channels to achieve a substantially uniform temperature across an inner surface of the dielectric window.

BRIEF DESCRIPTION OF THE DRAWINGS

FIG. 4 is a perspective view of a fluid control system.

DETAILED DESCRIPTION

Time-varying thermal loads are central to semiconductor wafer processing, where heat generation necessarily occurs on a discrete basis (wafer to wafer). Spatially varying thermal loads are also common in etch process modules, where plasma's density and proximity to components are non-uniform. Also, it is desirable for components of plasma processing chambers to be at certain temperatures during plasma processing and these components are not heated by the plasma until wafer processing begins. Circulating a hot liquid allows a first wafer to be processed without first wafer effects, but as plasma processing continues, the components are heated by the plasma such that the components need to be cooled to a target elevated temperature, as described in commonly-assigned US Published Patent Application No. 2008/0308228, hereby incorporated by reference in its entirety.

Figure 1:
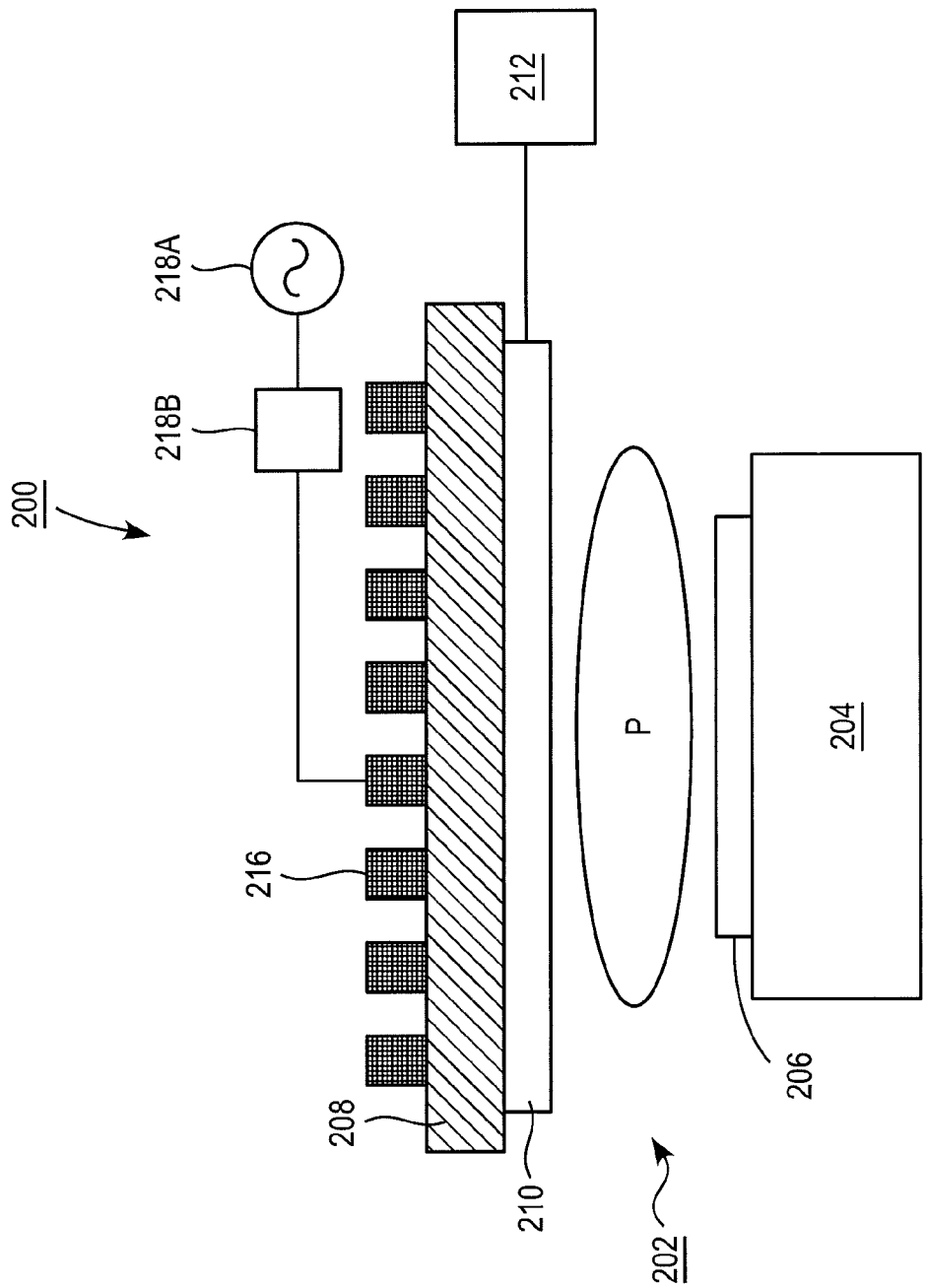
FIG. 1 is a cross-sectional view of an inductively coupled plasma (ICP) processing apparatus.
Figure 2:
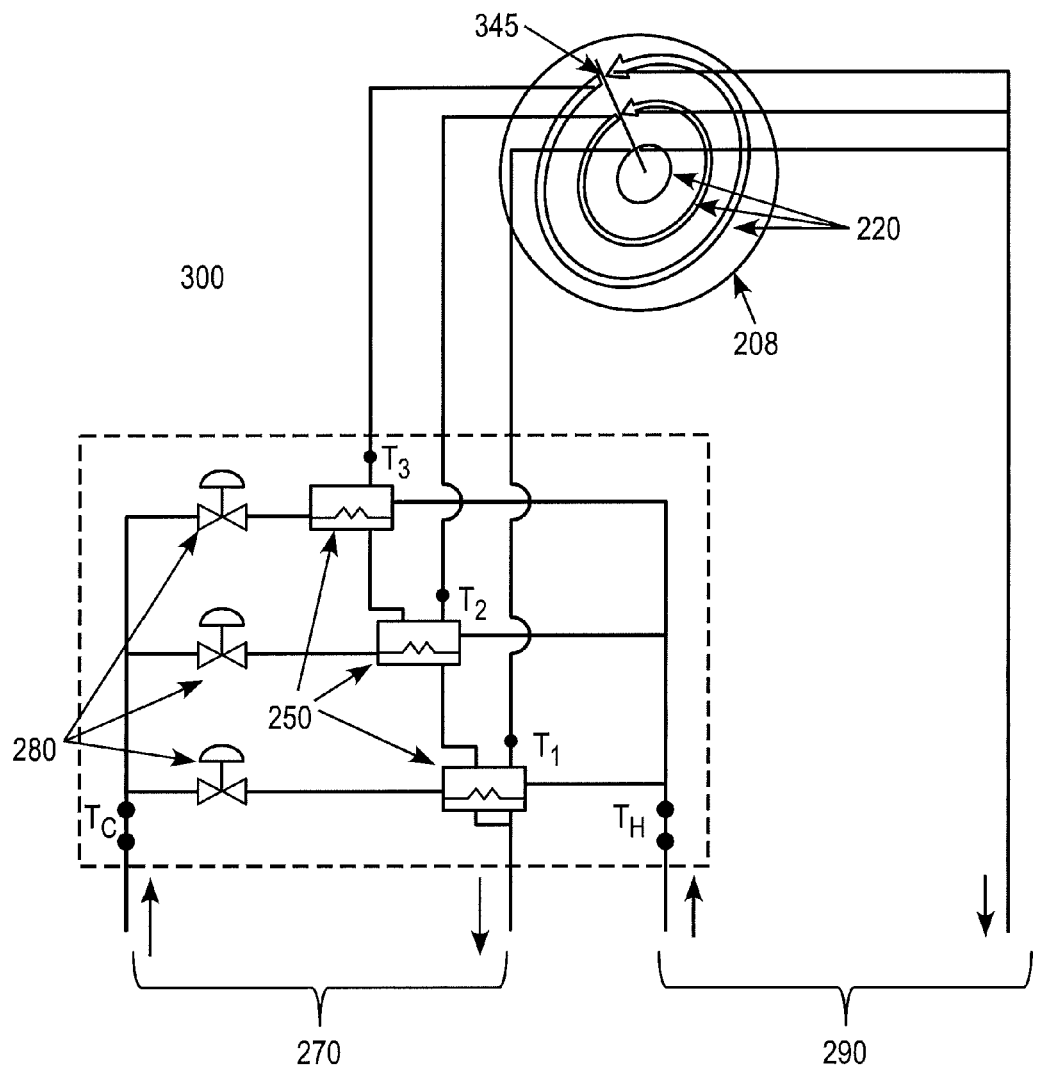
FIG. 2 is a schematic of a temperature control unit for a chamber window with three channels.

In an embodiment, as illustrated in FIG. 1, inductively coupled plasma (ICP) processing apparatus 200 can be used for depositing (e.g., plasma enhanced chemical vapor deposition or PECVD) and plasma etching of materials on substrates by supplying process gas into a vacuum chamber at a low pressure (i.e., below 100 mTorr) and the application of radio-frequency (RF) energy to the gas. FIG. 2 is a cross-sectional view of an embodiment of an ICP plasma processing apparatus 200. An example of an ICP plasma processing chamber is the TCP® etch or deposition system, manufactured by Lam Research Corporation, Fremont, Calif. The ICP plasma processing apparatus is also described, for example, in commonly-assigned U.S. Published Patent Application No. 2010/0116788, which is incorporated by reference in its entirety. Reaction chamber 202 includes a substrate support 204 for supporting the substrate 206 in the interior of the reaction chamber 202. Dielectric window 208 forms a top wall of reaction chamber 202. Process gases are directed to the interior of the reaction chamber 202 through a gas distribution member 210. Examples of gas distribution member 210 include a showerhead, gas injector or other suitable arrangement. A gas supply 212 supplies process gases to the interior of reaction chamber 202 through gas distribution member 210.

Once process gases are introduced into the interior of reaction chamber 202, they are energized into a plasma state by an energy source 216 supplying energy into the interior of reaction chamber 202. Preferably, the energy source 216 is an external planar antenna powered by an RF source 218A and RF impedance matching circuitry 218B to inductively couple RF energy into reaction chamber 202. An electromagnetic field generated by the application of RF power to planar antenna energizes the process gas to form a high-density plasma P (e.g., $10^{10}$-$10^{12}$ ions/cm$^3$) above substrate 206.

A dielectric window 208 underlies planar antenna and gas distribution member 210 is placed below dielectric window 208. Plasma P is generated in the zone between gas distribution member 210 and substrate 206, for either deposition or etching of substrate 206.

FIG. 2 shows an embodiment of temperature control unit 300, whereby the window 208 comprises three liquid circulating channels 220. Each of the three channels 220 is in fluid communication with separate hot liquid flow paths which are each in fluid communication with a single cold loop 270 and hot loop 290 passing through three heat exchangers 250. Flow control valves 280 may be disposed in cold loop 270 to modulate the flow rate of cold liquid through each heat exchanger. The cold liquid passes through the heat exchangers without mixing with the hot liquid. A recirculator (not shown) in hot loop 290 heats the hot liquid to a desired constant temperature so that the hot liquid is at the same temperature as it enters each heat exchanger. Hot liquid from hot loop 290 is the fluid circulated through the window. The hot loop 290 is a closed loop with hot liquid flowing at a constant rate. A recirculator (not shown) in cold loop 270 circulates cold liquid at a temperature below that of hot loop 290. Cold loop 270 is used to adjust the temperature of hot loop 290. Heat exchangers 250 link hot loop 290 and cold loop 270 and allow heat to be removed from each hot loop 290 and transferred to the cold loop 270. Control valves 280 adjust the flow rate of cold loop 270 through heat exchangers 250. Temperature control unit 300 can remove heat from ceramic window 208 using a coolant circulating through internal channels, such as a dielectric liquid (e.g., FLUORINERT®) or water.

Once wafer processing commences, the heat to maintain the fluid temperature can be derived solely from the plasma heat load. Control valves 280 are used to adjust the flow rate of cold loop 270, and thus the amount of heat removed from each hot loop 290 can be varied. Temperature control unit 300 may also comprise a control system, thermocouples to measure the fluid temperatures, the means to actuate the flow control valve (preferably a pneumatic supply modulated using a current-to-pressure transducer) and devices to measure the flow.

The independent temperature control of hot liquid entering each independent channel 220 allows for balancing of non-uniform heat flux across the window. At the locations where heat flux is higher, temperature of the hot liquid would be lowered by the respective heat exchanger to compensate. The hot liquid temperature in each channel is controlled based on temperature readings from thermocouples (not shown) embedded in ceramic window 208. Alternatively, instead of embedding thermocouples in ceramic window 208, thermocouples may be surface mounted on ceramic window 208 using a suitable adhesive Infrared sensors, non-contact sensors, phosphor temperature probes and optical temperature probes may be used instead of thermocouples, with these sensors and probes being either embedded in or surface mounted on ceramic window 208.

Figure 3:
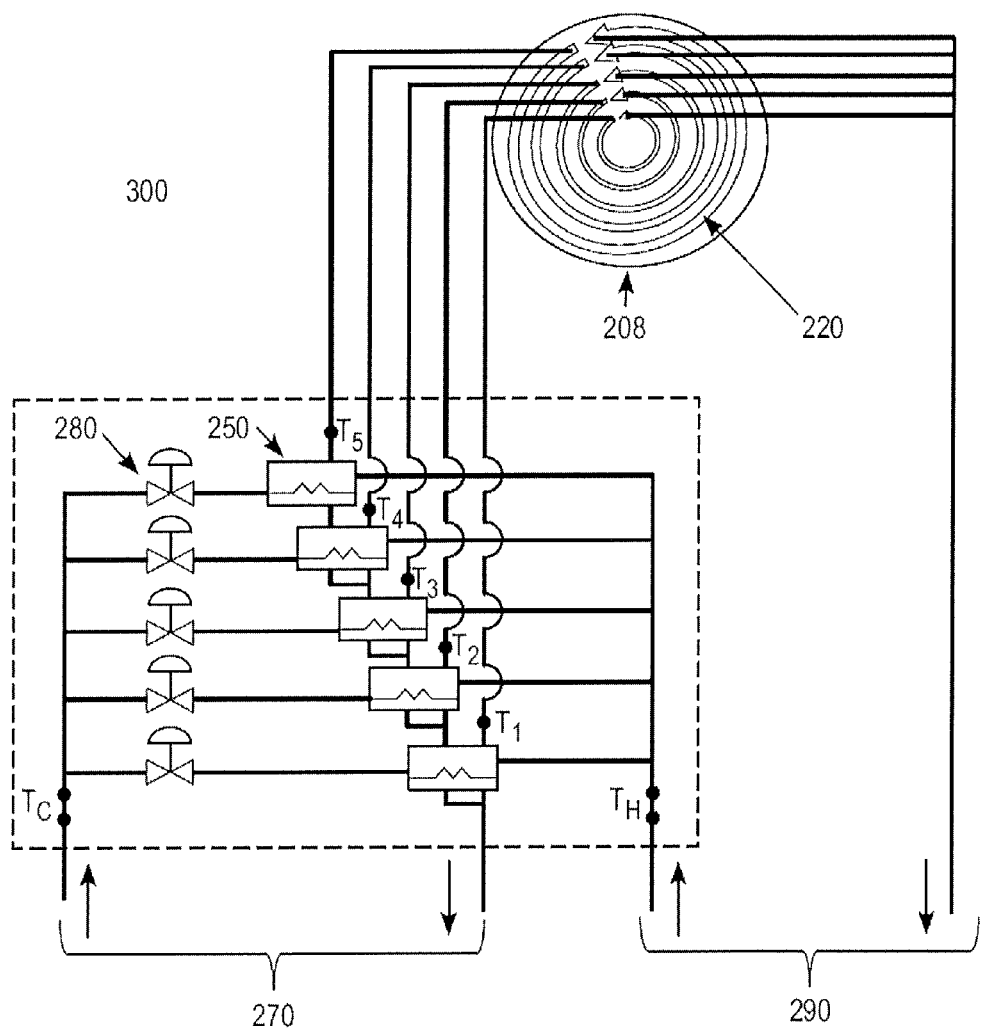
FIG. 3 is a schematic of a temperature control unit for a chamber window with five channels.

FIG. 3 shows another embodiment of temperature control unit 300. The embodiment of FIG. 3 is similar to that of FIG. 2 except that in the embodiment of FIG. 3, ceramic window 208 comprises five channels 220. Each of the five channels 220 is independent and separate flow paths which are each in fluid communication with a cold loop 270 and hot loop 290 linked by heat exchangers 250. Flow control valves 280 may be disposed in cold loop 270 to modulate the flow rate of cold liquid through each heat exchanger. A heater (not shown) in hot loop 290 is present to heat the hot liquid to a desired initial temperature.

The hot and cold loops may circulate fluid over a wide range of temperatures and such temperatures are not particularly limited. For example, the hot loop may circulate fluid from about 20° C. to about 120° C., or from about 30° C. to about 100° C., or from about 35° C. to about 80° C., or from about 40° C. to about 60° C., or from about 45° C. to about 55° C. For example, the cold loop may circulate fluid from about −20° C. to about 80° C., or from about −10° C. to about 70° C., or from about 0° C. to about 60° C., or from about 10° C. to about 50° C., or from about 20° C. to about 40° C.

The temperature control units of FIGS. 2-3 provide a number of advantages. For example, the temperature control units of FIGS. 2-3 are compact and the inexpensive combination of a flow control valves and heat exchangers can create rapid and accurate temperature transients. Such temperature control units substantially reduce cost requirements, while also abating thermal stresses in ceramic window 208 and tuning the temperature of ceramic window 208. The temperature control units of FIGS. 2-3 are capable of dynamic control of temperature in multiple, simultaneously circulating fluid channels and can control window temperature without using local heaters or chillers in contact with the window, which is advantageous in applications where heaters would interfere with RF power supply or where placement of heaters would be difficult due to space constraints.

The temperature control units of FIGS. 2-3 provide an increased capacity for heat dissipation. The increased thermal capacity is enabled by: 1) the use of liquid as the coolant rather than air, as liquid has superior heat transfer capability due to both greater heat capacity and higher heat transfer coefficient; 2) the use of multiple, independent fluid channels whereby the temperature of the coolant can be tailored to the inhomogeneous nature of the heat flux into the window, minimizing radial thermal gradients; and 3) disposing fluid circulating channels 220 close to the bottom surface of ceramic window 208, which reduces temperature gradients through the thickness of ceramic window 208.

The temperature control units of FIGS. 2-3 can also tune the surface temperature of ceramic window 208. This can be accomplished by disposing the fluid circulating channels 220 closer to a lowermost surface of window 208 than to an uppermost surface of window 208. Preferably, the fluid circulating channels 220 are located as close as possible to a lowermost surface of ceramic window 208, e.g., the surface closest to a wafer being processed. The amount of thermal diffusion between the fluid and a lowermost surface of ceramic window 208 is minimized, and thus the measurements of the varying fluid temperatures will be closely representative of tuned surface temperatures. With a larger number of independent fluid circulating channels, greater control of the radial temperature distribution can be achieved.

The temperature control units of FIGS. 2-3 are small in size and thus occupy very little fabrication space and permit locating the units in close proximity to the process module, allowing a very rapid control response. The units are also simple, as there is only one temperature control element per fluid channel (control valve 280). That makes the control scheme simple to implement and operate. Flow rate through the window is preferably at a constant, or substantially constant, rate which simplifies temperature control of the window. The temperature control units of FIGS. 2-3 have a "time constant" (e.g., the amount of time the fluid temperature takes to respond to a setpoint change is a function of conduction through the thin walls of the heat exchanger) that is very fast, allowing the units to be used in real-time control.

The temperature control units of FIGS. 2-3 are capable of rapid response to a control input such that desired temperatures of the circulating fluid can be achieved rapidly. For example, for every 5° C. change in fluid circulating temperature, the response time less than 1 minute, preferably less than 45 seconds, or less than 30 seconds, or less than 20 seconds. More preferably, the response time for every 5° C. change in fluid circulating temperature is about 3 to 15 seconds. Accordingly, the temperature control units of FIGS. 2-3 can achieve a response time for a 10° C. change in fluid circulating temperature in about 6 to 30 seconds and a 15° C. change in fluid circulating temperature in about 9 to 45 seconds.

The heat exchangers 250 may be arranged in a vertical array to minimize space occupied by the temperature control units as shown in FIG. 4. The type of heat exchanger is not particularly limited and may be a brazed plate heat exchanger, such as those available from SWEP International AB. The hot liquid of hot loop 290 is supplied by common line 296 to hot liquid inlets 291 at an upper end of the array, the cold liquid of cold loop 270 is supplied by common line 297 to cold liquid inlets 271 at a lower end of the array, the return line 298 receiving cold liquid of cold loop 270 from cold liquid outlets 272 at the upper end of the array, and individual lines (not shown) receiving the hot liquid of hot loop 290 from hot liquid outlets 292 at the lower end of the array. Control valves 280 may be disposed between cold liquid inlets 271 and heat exchangers 250. The types of control valves are not particularly limited, so long as the control valves possess sufficient precision and speed of operation. Preferably, the control valves are Burkert type 2301 globe control valves with position control.

Ceramic window 208 is preferably disc shaped with a diameter of preferably about 20 inches, but may be any suitable diameter depending on the size of the plasma chamber. Ceramic window 208 preferably comprises a ceramic top plate and a ceramic bottom plate, which may be joined by either co-firing or bonding. In co-firing, a glassy filler may be placed between the top plate and bottom plate and the assembly is then fired. In bonding, an epoxy or other suitable adhesive may be used to join the top plate and bottom plate. Ceramic window 208 has a thickness of about 0.5 to about 1.0 inches, and preferably, about 0.8 inch. Channels 220 may be created by machining two mating halves of ceramic window 208. The channels 220 are preferably machined into a lower surface of the top plate, but may also be formed in the bottom plate. Ceramic window 208 may be disposed in a plasma processing chamber such that a lowermost surface is closest to a substrate being processed and uppermost surface is furthest away from a substrate being processed.

Figure 5A:
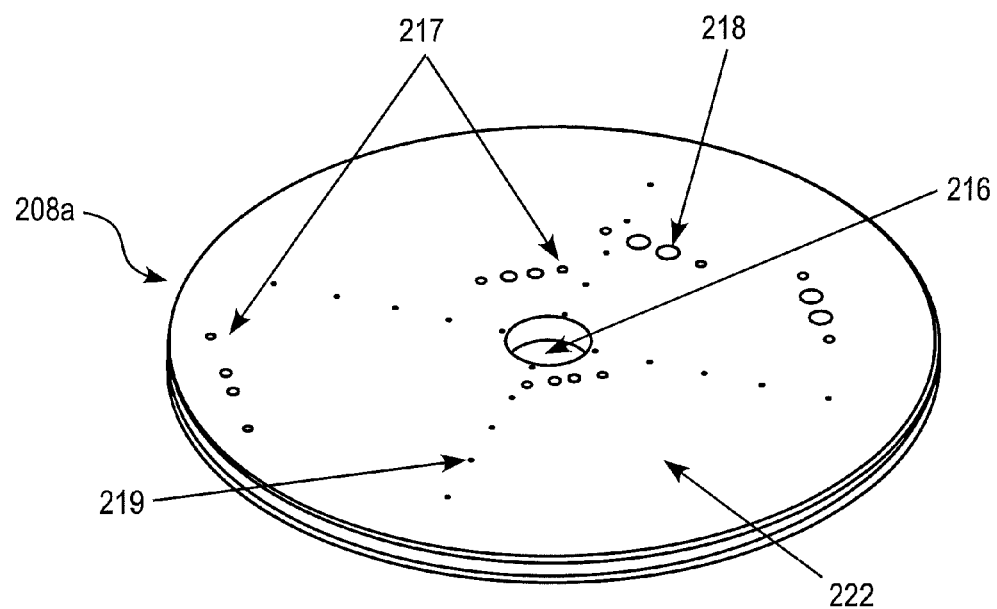
FIGS. 5A,B show a perspective view of a top surface and bottom surface, respectively, of a top plate of a ceramic window.
Figure 5B:
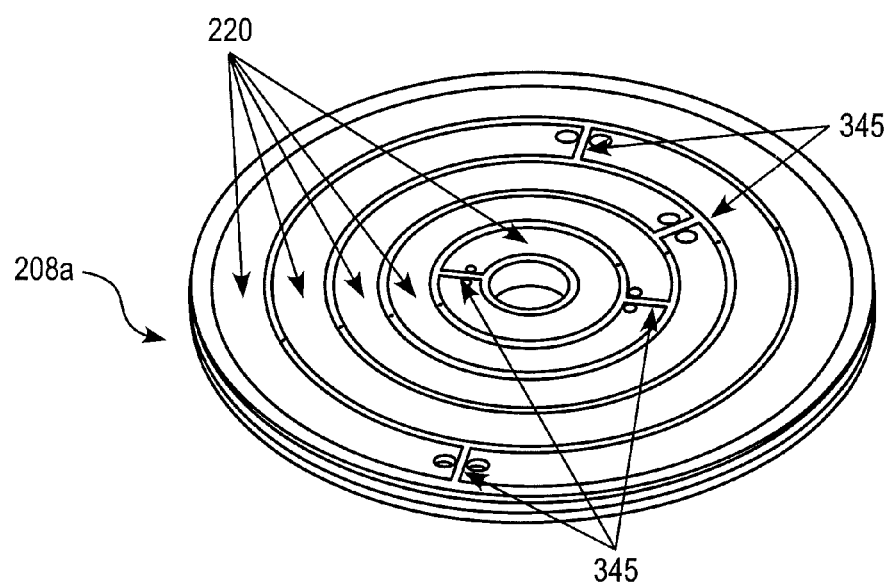

FIGS. 5A-B show an embodiment of a top plate 208a of ceramic window 208, wherein FIG. 5A shows a top surface of top plate 208a and FIG. 5B shows a bottom surface of top plate 208a. Top plate 208a comprises a central bore 216, a plurality of threaded holes 217 for attaching a manifold (not shown), a plurality of vertical risers 218 from fluid circulating channels 220 and a plurality of holes 219 for embedding temperature sensors, such as thermocouples. Preferably, the top plate 208a has a planar uppermost surface 222. Central bore 216 preferably has a diameter of about 1 to 2 inches and can be adapted to receive a gas injector, such as a ceramic gas injector, used to supply process gas to the plasma processing chamber. Commonly-assigned US Published Patent Application Nos. 2012/0309204 and 2011/0056626, both hereby incorporated by reference in their entireties, disclose gas injectors which may be used with ceramic window 208. Each of the threaded holes 217 may have a diameter from about 0.08 to about 0.75 inch, and preferably, from about 0.125 to about 0.5 inch. Each of the vertical risers 218 may have a diameter from about 0.125 to about 1.5 inch, and preferably, from about 0.25 to about 1.0 inch. Each of the holes 219 may have a diameter from about 0.005 to about 0.1 inch, and preferably, from about 0.015 to about 0.05 inch. Channels 220 are preferably machined into the bottom surface of top plate 208a and divided by radial walls 345 with a fluid inlet and fluid outlet on opposite sides of each radial wall 345.

Channels 220 preferably have heights of about 0.005-about 0.1 inch and widths of about 0.5 to 5 inches, and more preferably, have heights of about 0.010-about 0.030 inch and widths of about 1-about 2 inches. Each channel 220 may have the same height or width or differing heights and widths. For example, an innermost channel may have a height of about 0.030 inch and a width of about 1.3 inches and an outermost channel may have a height of about 0.030 inch and a width of about 1.6 inches. The channels 220 are preferably substantially circular in shape and may be disposed concentrically or non-concentrically with respect to each other. The channels may be divided by radial walls 345 with inlets and outlets on opposite sides of radial walls 345. Other channel shapes besides circular are also able to be used, such as rectangular.

The fluid circulating channels 220 have widths and heights that are chosen based on expected local heat flux. The channels 220 are preferably dimensioned to ensure high velocity and turbulent flow, which helps to ensure a sufficiently high heat transfer coefficient (HTC). However, if the channels 220 are not properly dimensioned, then the pressure required to sustain flow will be too high. A suitable tradeoff between HTC and pressure drop has been found with channel heights in the range of about 0.005-0.05 inch, and more preferably, about 0.010-0.030 inch. Flow rate are preferably chosen to balance heat transfer and pressure drop. The flow rate through each individual channel 220 is constant during operation, with the flow rates determined by two factors. The first factor is the operating pressure. The channels 220 are plumbed in parallel, so the operating pressure is identical for each channel. The operating pressure can range from 20 psi to 200 psi, with the desired operating pressure determined prior to operation based on the expected heat load into ceramic window 208. The second factor is the flow capacity of the respective channel 220, which is determined by channel dimensions, e.g., channel width and channel length. Flow rates through each channel are preferably about 1-about 10 liters per minute (lpm), and more preferably, about 2-about 5 liters per minute, and each channel 220 may have the same or differing flow rate.

Figure 6A:
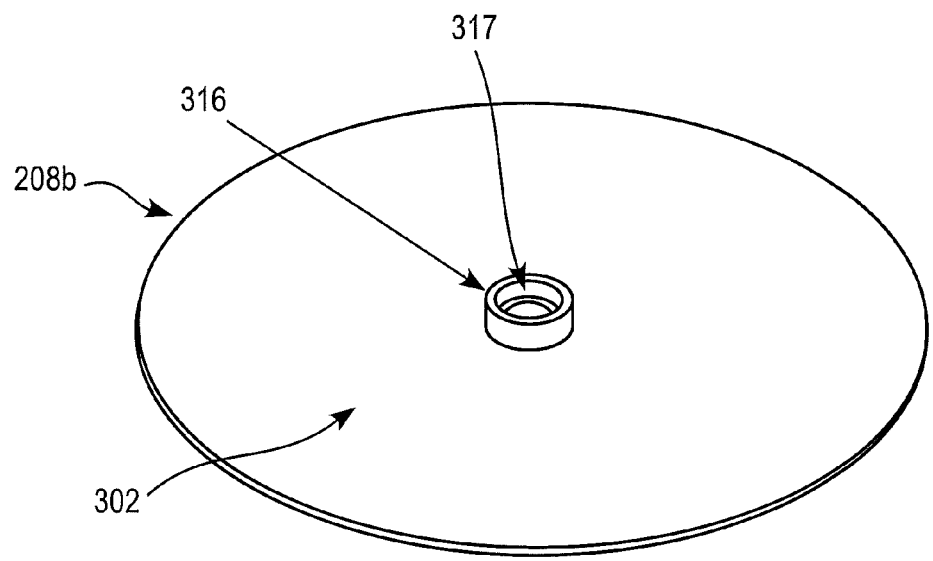
FIGS. 6A,B show a perspective view of a top surface and bottom surface, respectively, of a bottom plate of a ceramic window.
Figure 6B:
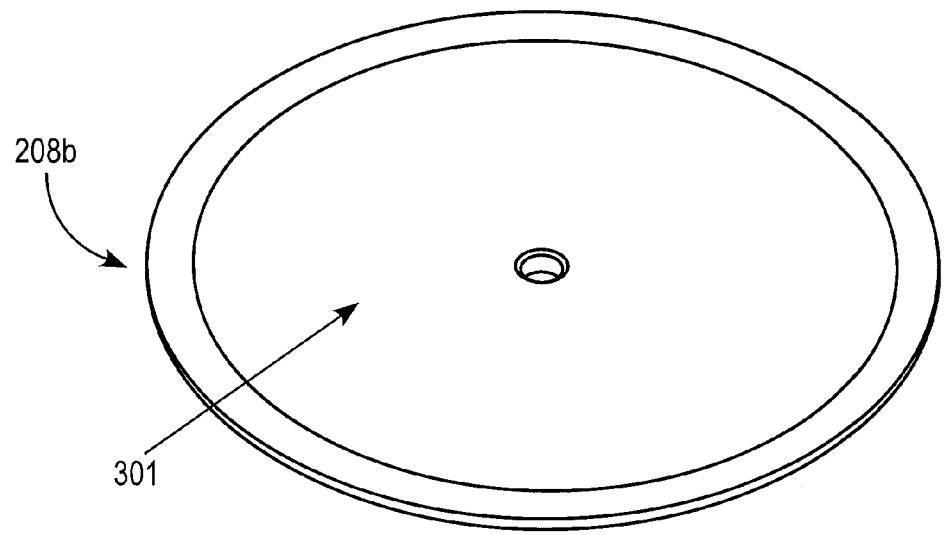

FIGS. 6A-B show an embodiment of a bottom plate 208b of ceramic window 208, wherein FIG. 6A shows a top surface of bottom plate 208b and FIG. 6B shows a bottom surface of bottom plate 208b. Preferably, bottom plate 208b has a planar lower surface 301 and a planar upper surface 302 with a central cylindrical hub 316 extending upward from the upper planar surface 302. The hub 316 may have a stepped bore 317 extending vertically therethrough sized to receive a gas injector which delivers process gas to the plasma chamber. Preferably, central cylindrical hub 316 having stepped bore 317 aligns vertically with central bore 216 of top plate 208a.

Figure 7:
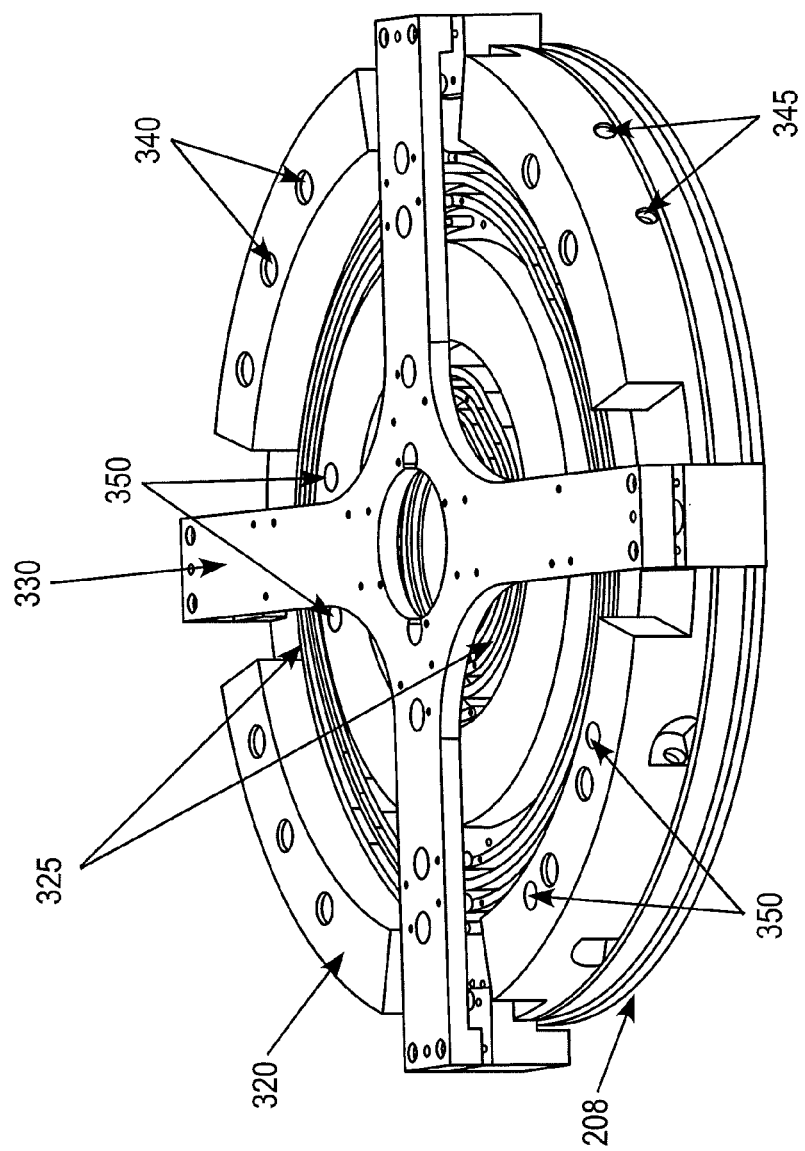
FIG. 7 is a perspective view of a window having a manifold.

To supply fluid to ceramic window 208, a manifold 320 may be disposed over ceramic window 208, as shown in FIG. 7. Preferably, manifold 320 overlies an uppermost surface 222 of dielectric window 208 and has internal flow passages 340, 345 aligned with the inlets and outlets in the uppermost surface 222 of the dielectric window in order to route fluid to the fluid circulating channels 220 and also allows for RF coils 325 to be disposed therein. In certain plasma processing chambers, inner and outer RF coils 325 may prevent tubing from reaching directly to fluid circulating channels 220, so manifold 320 is adapted to route fluid under RF coils 325 from an outer diameter of ceramic window 208 where fluid connections are more accessible. Manifold 320 comprises mounting holes 350 aligned with mounting holes in the uppermost surface 222 of the dielectric window.

Figure 8:
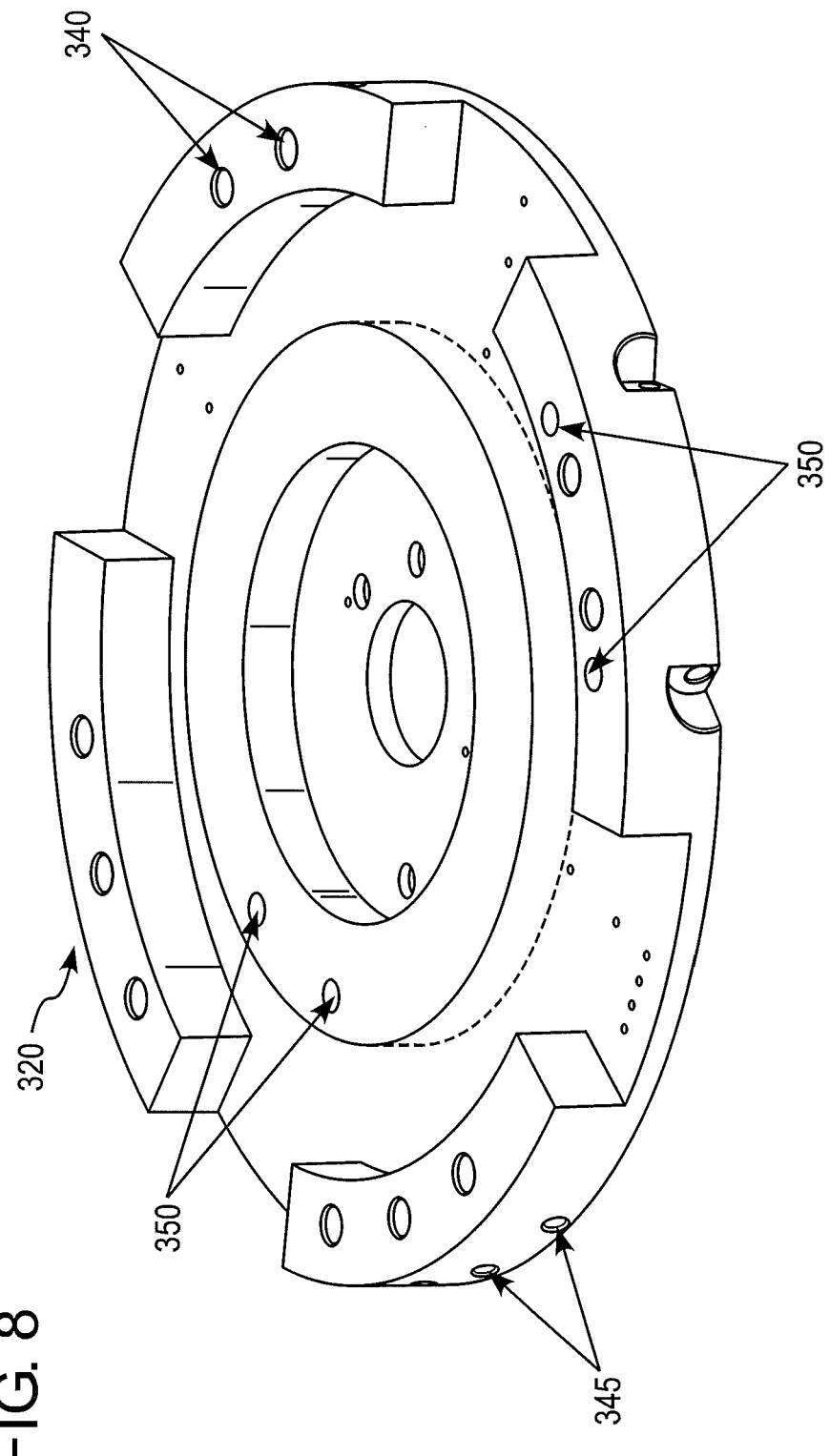
FIG. 8 is a perspective view of a manifold.

Flow passages 340 are vertically machined (e.g., drilled) in an upper surface of manifold 320 and connect with horizontally machined (e.g., drilled) flow passages 345. Flow passages 340, 345 align with the inlets and outlets in the uppermost surface 222 of the dielectric window. Flow passages 345 are sealed with a plug at an outer periphery to prevent fluid leakage. Flow passages 340 may be tapered or un-tapered or be threaded or un-threaded. Flow passages 340 are used for receiving fittings that allow for connections to a tube for fluid supply and return. Alternatively, fittings could be threaded directly into ceramic window 208 using a face seal. Bolts extending into threaded holes 217 (shown in FIG. 5A) of ceramic window 208 secure manifold 320 to an uppermost surface 222 of ceramic window 208. Alternatively, manifold 320 may be bonded to ceramic window 208 using a suitable bonding agent. Manifold 320 also insulates the top of ceramic window 208. A cover piece 330 may be disposed over manifold 320 to hold RF coils 325 in place. Manifold 320 may be made from any suitable material, such as plastic, ceramic or polymeric. Preferably, manifold 320 is made from glass-filled Teflon. An O-ring (not shown) may be disposed between manifold 320 and ceramic window 208 to provide a fluid seal. FIG. 8 shows manifold 320, whereby flow passages 340, 345 are more clearly shown.

Figure 9:
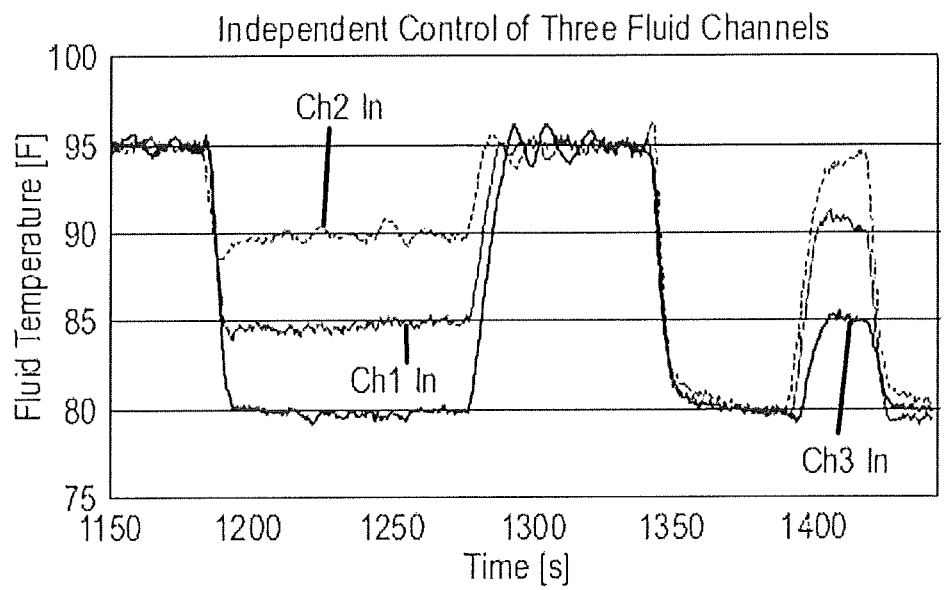
FIG. 9 shows the transient control of hot liquid in a window comprising three channels.

FIG. 9 shows the transient control of fluid temperature as related to the temperature control unit of FIG. 2. For FIG. 9, the hot liquid is circulated at a temperature of about 90° C. and the cold liquid is circulated at a temperature of about 60° C. Hot liquid circulated in the three fluid circulating channels, from the innermost to outermost channels, at a rate of 2.5 liters per minute, 3.3 liters per minute and 4.4 liters per minute, respectively. As can be seen, for the initial temperature drop from 95° C. to about 80° C., the unit of FIG. 2 has a response time of about 10 seconds for each of the fluid circulating channels. For the initial temperature increase from 80° C. to about 95° C., the unit of FIG. 2 has a response time of about 15 seconds for each of the fluid circulating channels. For the second temperature drop from 95° C. to about 80° C., the unit of FIG. 2 has a response time of about 10 seconds for each of the fluid circulating channels.

Figure 10:
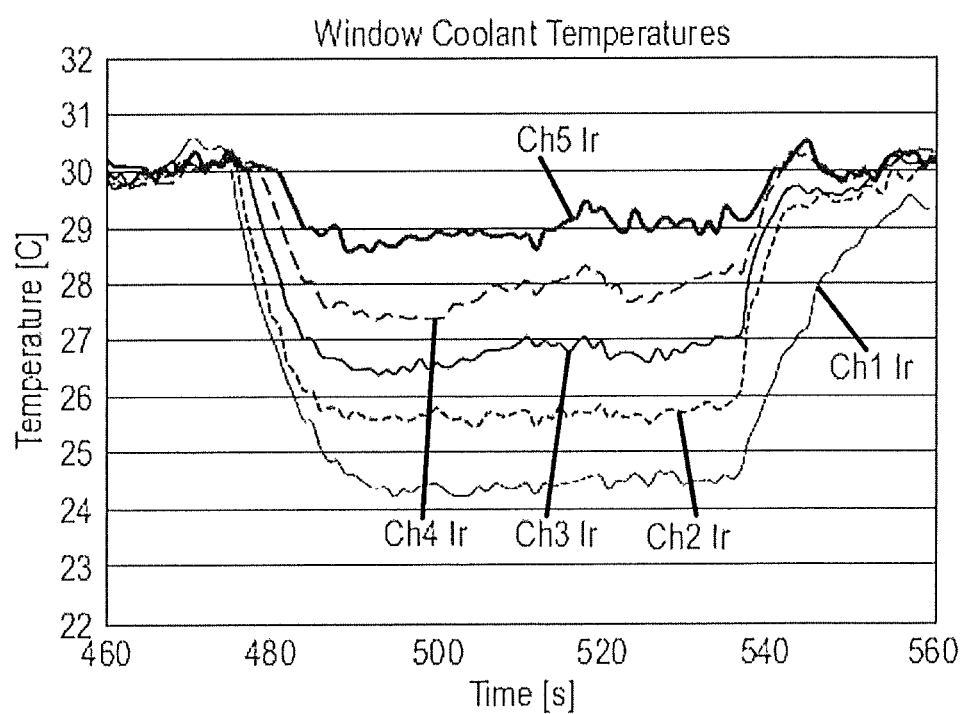
FIG. 10 shows the transient control of hot liquid in a window comprising five channels.

FIG. 10 shows the transient control of fluid temperature as related to the temperature control unit of FIG. 3. For FIG. 10, the hot liquid circulated at a temperature of about 35° C. and the cold liquid circulated at a temperature of about 19° C. Fluid circulated in the five fluid circulating channels, from the innermost to outermost channels, at a rate of 2.4 liters per minute, 4.2 liters per minute, 3.6 liters per minute, 4.6 liters per minute and 4.4 liters per minute, respectively. As can be seen, for the temperature drop from 30° C. to about 25° C. for the outermost channel (lowermost trace), the unit of FIG. 3 has a response time of about 5 seconds. For the temperature drop from 30° C. to about 26° C. for the second outermost channel (second lowermost trace), the unit of FIG. 3 has a response time of less than about 5 seconds. For the temperature drop from 30° C. to about 27° C. for the middle channel (middle trace), the unit of FIG. 3 has a response time of less than about 5 seconds. For the temperature drop from 30° C. to about 28° C. for the second innermost channel (second uppermost trace), the unit of FIG. 3 has a response time of less than about 5 seconds. For the temperature drop from 30° C. to about 29° C. for the innermost channel (uppermost trace), the unit of FIG. 3 has a response time of less than about 5 seconds. Preferably, heat exchangers 250 effect a change in temperature of an annular zone below each channel of at least about 0.1° C. per second, or at least about 0.25° C. per second, or at least about 0.5° C. per second, or at least about 0.75° C. per second or at least about 1° C. per second.

A method of controlling the temperature of dielectric window 208 may comprise plasma processing a semiconducting substrate in the chamber; circulating the hot liquid through the at least first and second channels; and adjusting a temperature of the hot liquid flowing through the at least first and second channels to achieve a substantially uniform temperature across an inner surface of the dielectric window. Adjusting the temperature of the hot liquid may further comprise measuring temperatures at different locations across the dielectric window and sending signals representative of the measured temperatures to a control unit which operates valves controlling flow rates of the cold liquid through the at least first and second heat exchangers to adjust the temperature of the hot liquid passing through the heat exchangers and thereby control localized temperatures in zones of the dielectric window adjacent the first and second channels. Thus, adjusting the temperature of the hot liquid in each isolated fluid channel can achieve a substantially uniform temperature across the inner surface of the dielectric window.

It has been found that a rate of changing the temperature of the fluid circulating the in fluid circulating channels 220 of temperature control unit 300 is about 0.25° C. to about 2° C. per second, or about 0.5° C. to about 1.5° C. per second, or about 0.75° C. to about 1° C. per second. Other rates of temperature change are possible depending on the flow rates of the fluid as well as the temperature of the hot and cold loops. It has also been found that a heat flux of about 50 kW/m$^2$ through ceramic window 208 (corresponding to an upper limit of about 5 kW of total power applied by the RF coils) corresponds to a circulating fluid temperature decrease of about 5° C.-30° C. to maintain a constant surface temperature of ceramic window 208. Preferably, a heat flux of about 50 kW/m$^2$ through ceramic window 208 corresponds to a circulating fluid temperature decrease of about 10° C.-20° C. to maintain a constant surface temperature of ceramic window 208, or about a 14° C.-16° C. temperature decrease.

Although the present invention has been described in connection with preferred embodiments thereof, it will be appreciated by those skilled in the art that additions, deletions, modifications, and substitutions not specifically described can be made without departing from the spirit and scope of the invention as defined in the appended claims.

What is claimed is:

1. A temperature controlled dielectric window of an inductively coupled plasma processing chamber comprising:
    a dielectric window forming a top wall of the plasma processing chamber having at least first and second channels therein, each of the first and second channels having an inlet and outlet to circulate temperature controlled liquid in the channels; and
    a liquid circulating system having a source of cold liquid circulating in a first closed loop which is not in fluid communication with the channels, a source of hot liquid circulating in a second closed loop which is in fluid communication with the channels, and at least first and second heat exchangers;
    the first heat exchanger connected to the source of cold liquid, the source of hot liquid and the inlet of the first channel such that the cold liquid passes through the first heat exchanger at a controllable flow rate and temperature of the hot liquid is adjusted by heat exchange with the cold liquid as the hot liquid passes through the first heat exchanger and then through the inlet of the first channel;
    the second heat exchanger connected to the source of cold liquid, the source of hot liquid and the inlet of the second channel such that the cold liquid passes through the second heat exchanger at a controllable flow rate and temperature of the hot liquid is adjusted by heat exchange with the cold liquid as the hot liquid passes through the second heat exchanger and then through the inlet of the second channel.

2. The temperature controlled dielectric window of claim 1, wherein the first closed loop includes a main line, a first branch line in fluid communication with the main line and the first heat exchanger, a second branch line in fluid communication with the main line and the second heat exchanger, valves along the first and second branch lines and a return line which returns cold liquid from the first and second heat exchangers to the source of cold liquid, the liquid circulation system including a control system receiving signals from thermocouples embedded in the dielectric window and signals from control valves measuring flow rates of the cold liquid through the first and second heat exchangers, the control system operating the control valves to control a flow rate of the cold liquid through the first and second heat exchangers.

3. The temperature controlled dielectric window of claim 1, wherein the dielectric window comprises a top plate of ceramic material and a bottom plate of ceramic material, the top plate having the first and second channels in a lower surface thereof, and the top and bottom plates are joined by co-firing or by bonding.

4. The temperature controlled dielectric window of claim 3, wherein the first and second channels have a height of about 0.01 to about 0.03 inches and width of about 1 to 2 inches.

5. The temperature controlled dielectric window of claim 1, wherein the hot liquid is a dielectric liquid and the cold liquid is water.

6. The temperature controlled dielectric window of claim 1, further comprising a manifold overlying an upper surface of the dielectric window, the manifold having horizontally aligned flow passages vertically aligned with the inlets and outlets and horizontally aligned mounting holes vertically aligned with mounting holes in the upper surface of the dielectric window.

7. The temperature controlled dielectric window of claim 1, wherein the dielectric window includes a bore in a center of the dielectric window, the bore configured to receive a gas injector which delivers process gas into the chamber.

8. The temperature controlled dielectric window of claim 2, wherein the dielectric window further includes third, fourth and fifth channels, the liquid circulating system including third, fourth and fifth heat exchangers;

the third heat exchanger connected to the source of cold liquid, the source of hot liquid and the inlet of the third channel such that the cold liquid passes through the third heat exchanger at a controllable flow rate and temperature of the hot liquid is adjusted by heat exchange with the cold liquid as the hot liquid passes through the third heat exchanger and then through the inlet of the third channel;

the fourth heat exchanger connected to the source of cold liquid, the source of hot liquid and the inlet of the fourth channel such that the cold liquid passes through the fourth heat exchanger at a controllable flow rate and temperature of the hot liquid is adjusted by heat exchange with the cold liquid as the hot liquid passes through the fourth heat exchanger and then through the inlet of the fourth channel;

the fifth heat exchanger connected to the source of cold liquid, the source of hot liquid and the inlet of the fifth channel such that the cold liquid passes through the fifth heat exchanger at a controllable flow rate and temperature of the hot liquid is adjusted by heat exchange with the cold liquid as the hot liquid passes through the fifth heat exchanger and then through the inlet of the fifth channel;

the first closed loop further includes a third branch line in fluid communication with the main line and the third heat exchanger, a fourth branch line in fluid communication with the main line and the fourth heat exchanger, a fifth branch line in fluid communication with the fifth heat exchanger, valves along the third, fourth and fifth branch lines and the return line returns cold liquid from the third, fourth and fifth heat exchangers to the source of cold liquid, the control system receiving signals from thermocouples embedded in the dielectric window and signals from control valves measuring flow rates of the cold liquid through the third, fourth and fifth heat exchangers, the control system operating the control valves to control a flow rate of the cold liquid through the third, fourth and fifth heat exchangers.

9. The temperature controlled dielectric window of claim 8, wherein the heat exchangers are arranged in a vertical array with the hot liquid supplied by a common line to inlets at an upper end of the array, the cold liquid supplied to inlets at a lower end of the array, the return line receiving cold liquid from outlets at the upper end of the array, and individual lines receiving the hot liquid from outlets at the lower end of the array.

10. The temperature control unit of claim 1, wherein the hot liquid is flowed through the channels at a constant flow rate of 1 to 10 liter per minute.

11. The temperature controlled dielectric window of claim 1, wherein the dielectric window comprises a top plate and a bottom plate, the bottom plate having a planar lower surface and a planar upper surface with a central cylindrical hub extending upward from the upper surface, the hub having a stepped bore extending vertically therethrough, the bore sized to receive a gas injector which delivers process gas to the plasma chamber, the top plate having a planar upper surface, a planar lower surface and a central bore vertically aligned with the stepped bore, the lower surface of the top plate having concentric channels, each of the channels divided by a single radial wall with inlet and outlet on opposite sides of the radial wall.

12. The temperature controlled dielectric window of claim 1, wherein the heat exchangers effect a change in temperature of an annular zone below each channel of at least 1° C. per second.

13. The temperature controlled dielectric window of claim 1, wherein the hot liquid is flowed through each channel at a constant flow rate.

14. A plasma processing chamber comprising the temperature controlled dielectric window of claim 1.

15. A method of controlling the temperature of the temperature controlled dielectric window of claim 1 installed in a plasma processing chamber, comprising:
 plasma processing a semiconducting substrate in the chamber;
 circulating the hot liquid through the at least first and second channels; and
 adjusting a temperature of the hot liquid flowing through the at least first and second channels to achieve a uniform temperature across an inner surface of the dielectric window.

16. The method of claim 15, wherein process gas is supplied to the chamber by a gas injector mounted in a center of the dielectric window and at least one RF coil mounted above the dielectric window energized the process gas into a plasma state in the chamber.

17. The method of claim 15, wherein the adjusting the temperature of the hot liquid comprises:
 measuring temperatures at different locations across the dielectric window and sending signals representative of the measured temperatures to a control unit which operates valves controlling flow rates of the cold liquid through the at least first and second heat exchangers to adjust the temperature of the hot liquid passing through the heat exchangers and thereby control localized temperatures in zones of the dielectric window adjacent the first and second channels.

18. The method of claim 17, wherein the adjusting the temperature of the hot liquid comprises supplying the heating fluid at different temperatures to each isolated fluid channel to achieve a uniform temperature across the inner surface of the dielectric window.

19. The method of claim 17, wherein the cold liquid circulates in a first closed loop which is not in fluid communication with the channels and the hot liquid circulates in a second closed loop which is in fluid communication with the channels, the cold liquid being maintained at a constant temperature in the first closed loop and the hot liquid being supplied to the first and second heat exchanges at a constant temperature.

20. The method of claim 19, wherein the dielectric window further includes third, fourth and fifth channels and the liquid circulating system further includes third, fourth and fifth heat exchangers, the third heat exchanger connected to the source of cold liquid, the source of hot liquid and the inlet of the third channel such that the cold liquid passes through the third heat exchanger at a controllable flow rate and temperature of the hot liquid is adjusted by heat exchange with the cold liquid as the hot liquid passes through the third heat exchanger and then through the inlet of the third channel, the fourth heat exchanger connected to the source of cold liquid, the source of hot liquid and the inlet of the fourth channel such that the cold liquid passes through the fourth heat exchanger at a controllable flow rate and temperature of the hot liquid is adjusted by heat exchange with the cold liquid as the hot liquid passes through the fourth heat exchanger and then through the inlet of the fourth channel, and the fifth heat exchanger connected to the source of cold liquid, the source of hot liquid and the inlet of the fifth channel such that the cold liquid passes through the fifth heat exchanger at a controllable flow rate and temperature of the hot liquid is adjusted by heat exchange with the cold liquid as the hot liquid passes through the fifth heat exchanger and then through the inlet of the fifth channel, the first closed loop further includes a third branch line in fluid communication with the main line and the third heat exchanger, a fourth branch line in fluid communication with the main line and the fourth heat exchanger, a fifth branch line in fluid communication with the fifth heat exchanger, valves along the third, fourth and fifth branch lines and the return line returns cold liquid from the third, fourth and fifth heat exchangers to the source of cold liquid, the control system receiving signals from thermocouples embedded in the dielectric window and signals from control valves measuring flow rates of the cold liquid through the third, fourth and fifth heat exchangers, the control system operating the control valves to control a flow rate of the cold liquid through the third, fourth and fifth heat exchanger such that temperatures across a lower surface of the dielectric window are uniform during processing of the semiconductor substrate.

* * * * *